(12) United States Patent
Kubota et al.

(10) Patent No.: US 6,321,817 B1
(45) Date of Patent: Nov. 27, 2001

(54) ELECTRONIC COMPONENT SUPPLY DEVICE

(75) Inventors: Shuichi Kubota; Takao Kashiwazaki; Koji Okawa; Tadashi Endo, all of Yamanashi; Masato Tanino, Kofu; Akira Kabeshita, Hirakata, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/461,888

(22) Filed: Dec. 15, 1999

(30) Foreign Application Priority Data

Dec. 25, 1998 (JP) .................................................. 10-371620

(51) Int. Cl.⁷ ............................... B32B 35/00; B65H 5/28
(52) U.S. Cl. ........................... 156/584; 156/344; 221/25; 221/72; 221/87; 414/411; 414/416
(58) Field of Search ..................................... 156/344, 584; 221/25, 72, 73, 79, 87; 226/8, 120, 139; 414/411, 416, 425

(56) References Cited

U.S. PATENT DOCUMENTS

| | | | |
|---|---|---|---|
| 5,214,653 | * | 5/1993 | Akahori et al. ....................... 156/584 |
| 5,839,637 | * | 11/1998 | Kanai ............................... 414/416 X |
| 6,196,783 | * | 3/2001 | Foster ................................... 414/416 |

FOREIGN PATENT DOCUMENTS

| | | |
|---|---|---|
| 3736563A1 | 5/1988 | (DE) . |
| 0817560A2 | 1/1998 | (EP) . |
| 0838991A1 | 4/1998 | (EP) . |

* cited by examiner

Primary Examiner—Mark A. Osele
(74) Attorney, Agent, or Firm—Jordan and Hamburg LLP (57) ABSTRACT

In an electronic component supply device electronic components are accommodated within cavities formed in a carrier tape of which surface is covered with a top tape. A peeling portion for peeling off the top tape from the carrier tape includes a peel-away cutout portion cut into a tape transfer direction. A thin plate has an angled portion having a rounded portion. A concavity, in which the thin plate operates, is formed in the tape pressing member downstream of the peel-away cutout portion in the tape transfer direction.

4 Claims, 7 Drawing Sheets

ELECTRONIC COMPONENT SUPPLY DEVICE

BACKGROUND OF THE INVENTION

The present invention relates to an electronic component supply device wherein electronic components, held within cavities formed in a carrier tape, are removed while a top tape covering the surface of the carrier tape is peeled away.

A conventional electronic component supply device is described with reference to FIGS. 5 through 7. As shown in FIG. 6, electronic components 3 are held within cavities 2 formed in a carrier tape 1; the surface of the carrier tape 1 is covered with a removable top tape 5 to prevent the electronic components 3 from jumping out of the cavities.

Figure 5:
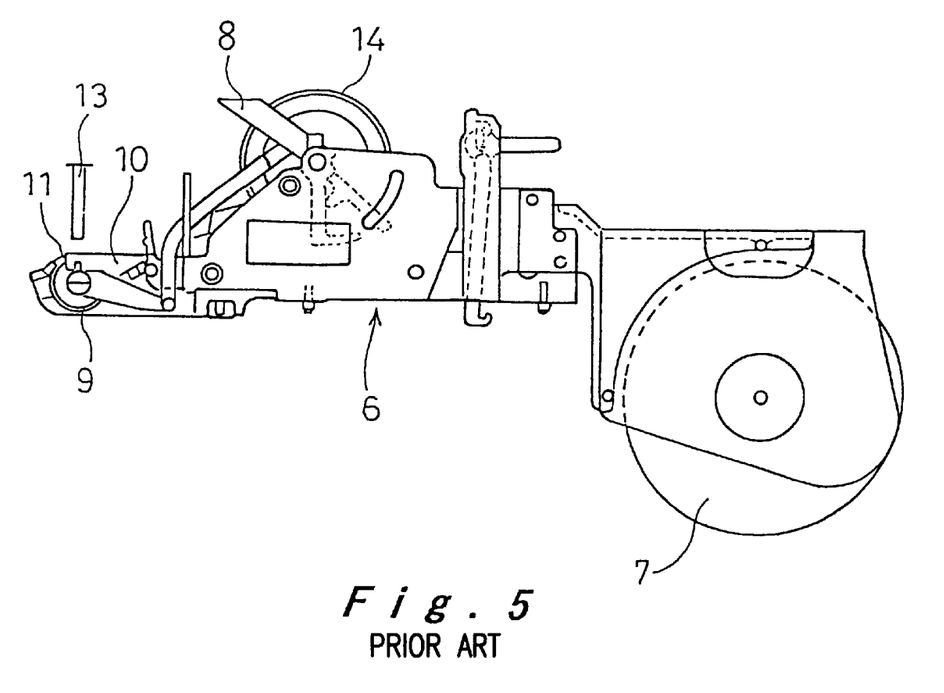
FIG. 5 is a front view showing the entire constitution of a conventional electronic component supply device.
Figure 6:
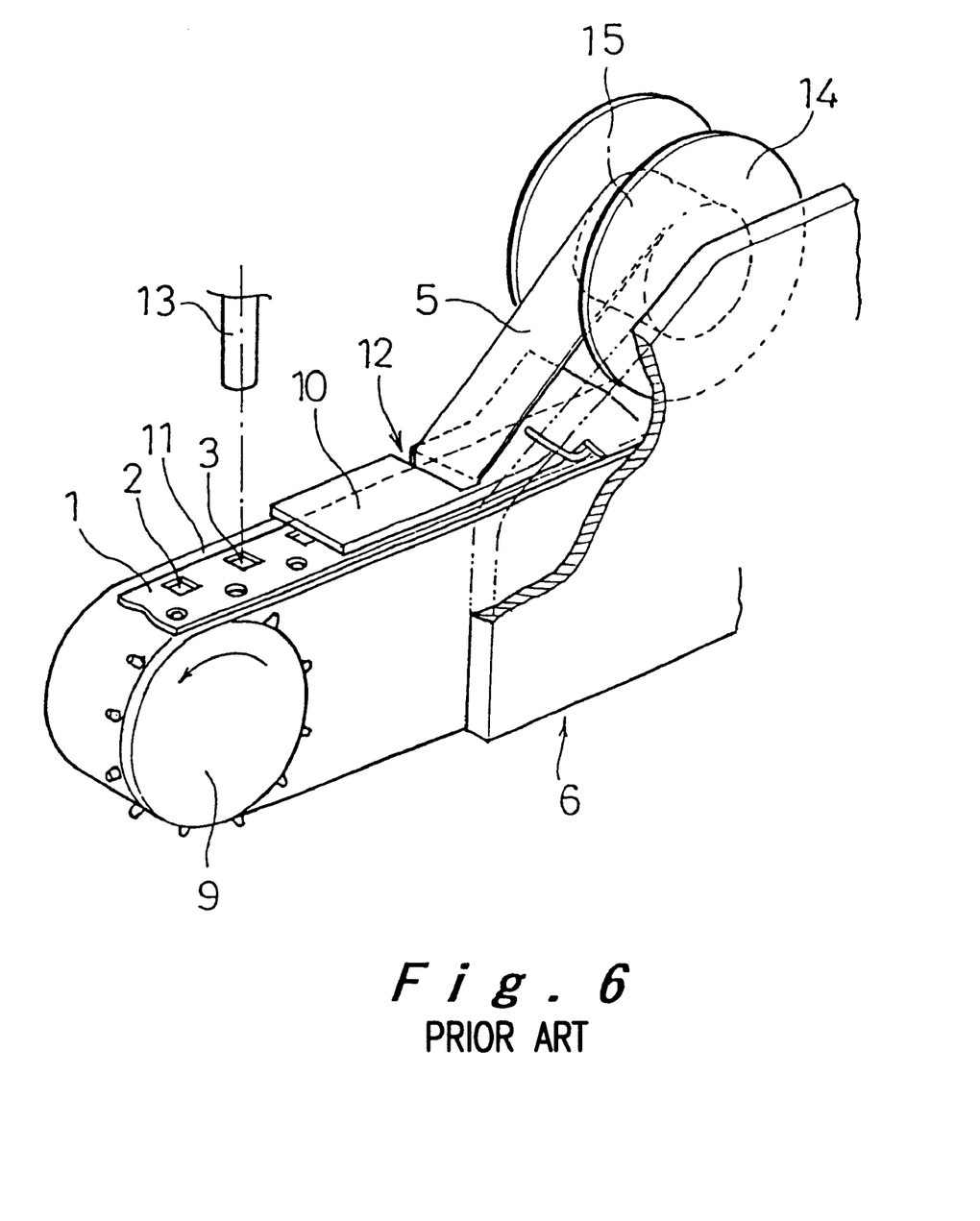
FIG. 6 is a perspective view showing the general constitution of the distal end portion of the same conventional electronic component supply device.

The carrier tape 1 accommodating the electronic components 3 is wound on a reel 7 which is installed on the base end portion of the electronic component supply device 6 as shown in FIG. 5. The carrier tape is drawn out from the reel 7 and transferred by a tape feed wheel 9 that is linked to the reciprocating action of a feed lever 8 and rotates intermittently in one direction. The carrier tape 1 is transferred while being pressed by a tape pressing member 10 against the tape transfer surface 11 in the distal end of the electronic component supply device 6 as shown in FIG. 6.

As the carrier tape 1 is transferred at a prescribed pitch by the tape feed wheel 9, the top tape 5 is separated therefrom by a peeling portion 12 comprising a peel-away cutout portion 117 formed in the tape pressing member 10 and is drawn at an angle backwards (in the direction of arrow B). Thereafter, the electronic components 3 are removed by a suction nozzle 13.

The top tape 5, which is peeled away and drawn at an angle backwards, is wound onto a take-up cap 15, mounted on a take-up ratchet 14 which can be rotated in only one direction by the reciprocating action of the feed lever 8.

Figure 7:
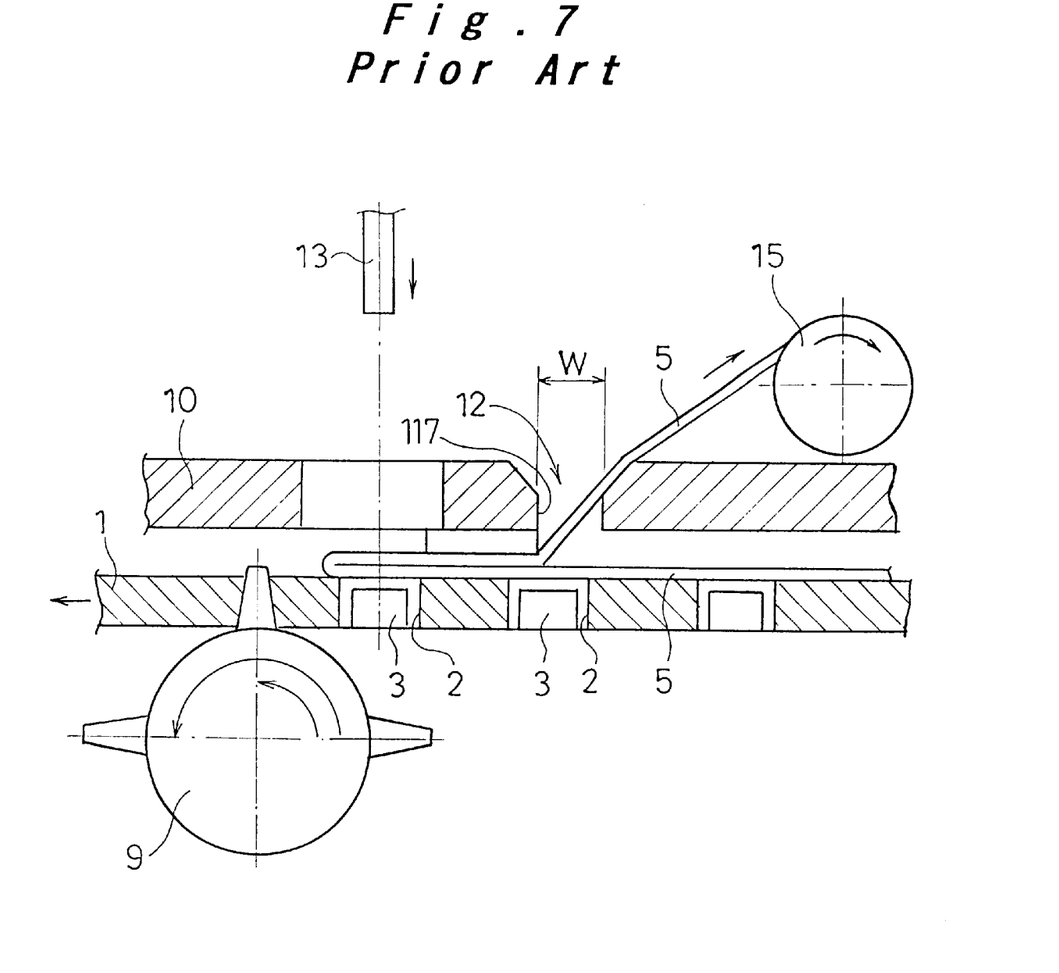
FIG. 7 is a cross sectional view showing major parts of the same conventional electronic component supply device.

However, with the above-described conventional constitution, there is a risk that the top tape 5 will enter between the portion of the tape pressing member 10 and the carrier tape 1 at a point downstream of the peeling portion 12 in the tape transfer direction, as shown in FIG. 7, depending on the relationship between the width W of the peel-away cutout portion 117 in the peeling portion 12, the adhesive strength of the top tape 5 and carrier tape 1, the amount of rotation and rotary speed of the tape feed wheel 9, and the winding force by the receiving ratchet 14.

The problem is therefore that the top tape 5 may cover the cavities 2 at the position where the suction nozzle 13 removes the electronic components 3, resulting in problems in taking out the electronic components 3.

SUMMARY OF THE INVENTION

With the foregoing problems with the background art in view, it is an object of the present invention to provide an electronic component supply device that is able to provide a stable supply of electronic components without any risk of the top tape covering the cavities at the position where the electronic components are removed.

In the electronic component supply device according to the present invention, the peeling portion for separating the top tape from the carrier tape comprises a peel-away cutout portion formed in the tape pressing member, and a thin plate which can be elastically deformed. The base end of the thin plate is fixed to the lower surface of the tape pressing member facing the upper surface of the carrier tape at a location downstream of the peel-away cutout portion of the tape pressing member in the tape transfer direction, while the free end of the thin plate is protruded at an angle upwards toward the peel-away cutout portion.

The thin plate stops the top tape that attempts to enter below the tape pressing member, and reduces the load exerted to the top tape by the elastic deformation, whereby the top tape is prevented from being caught between the tape pressing member and the carrier tape, and the top tape returns spontaneously to its normal state. The top tape peeling operation may be destabilized due to any of the increase in the rotation speed of the tape feed wheel in response to the demands for high-speeded operation, or variations due to changes over time in the adhesive strength of the top tape, and differences in the properties of types of adhesive and carrier tape materials supplied by different manufacturers. Such risk is eliminated according to the present invention.

Thanks to the feature of preventing the top tape from being caught as described above, problems with removal of the electronic components are sharply reduced and electronic components are supplied more efficiently. Down time of machinery for mounting electronic components resulting from problems with the supply of electronic components is reduced, whereby high operating rates in the machinery can be realized.

If a concavity is formed in the tape pressing member so that the thin plate can deform elastically in this concavity, a space in which the free end of the thin plate performs its function is ensured without having to enlarge the peel-away cutout portion of the tape pressing member. Furthermore, stable operation of the angled portion can be ensured because extreme deformation of the angled portion is limited by the concavity.

If the thin plate is given the resiliency such that it deforms elastically with a load smaller than the peeling force of the top tape, the thin plate can elastically deform upwards without failure and thereby smoothly reduce the load exerted to the top tape when it returns to its normal state.

With a constitution wherein at least the distal end of the thin plate facing the peel-away cutout portion is formed in a rounded shape and other portions thereof have a width sufficient to cover the entirety of the electronic components within the cavities, it becomes possible to protect and restrict the electronic components within the cavities with the thin plate after the top tape is peeled away.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF PREFERRED EMBODIMENTS

One embodiment of the electronic component supply device according to the present invention will be hereinafter described with reference to FIGS. 1 through 4. The general construction of the electronic component supply device is substantially identical to the conventional device described with reference to FIGS. 5 and 6. Same reference numerals are used for the same elements and the description thereof will be omitted.

Figure 1:
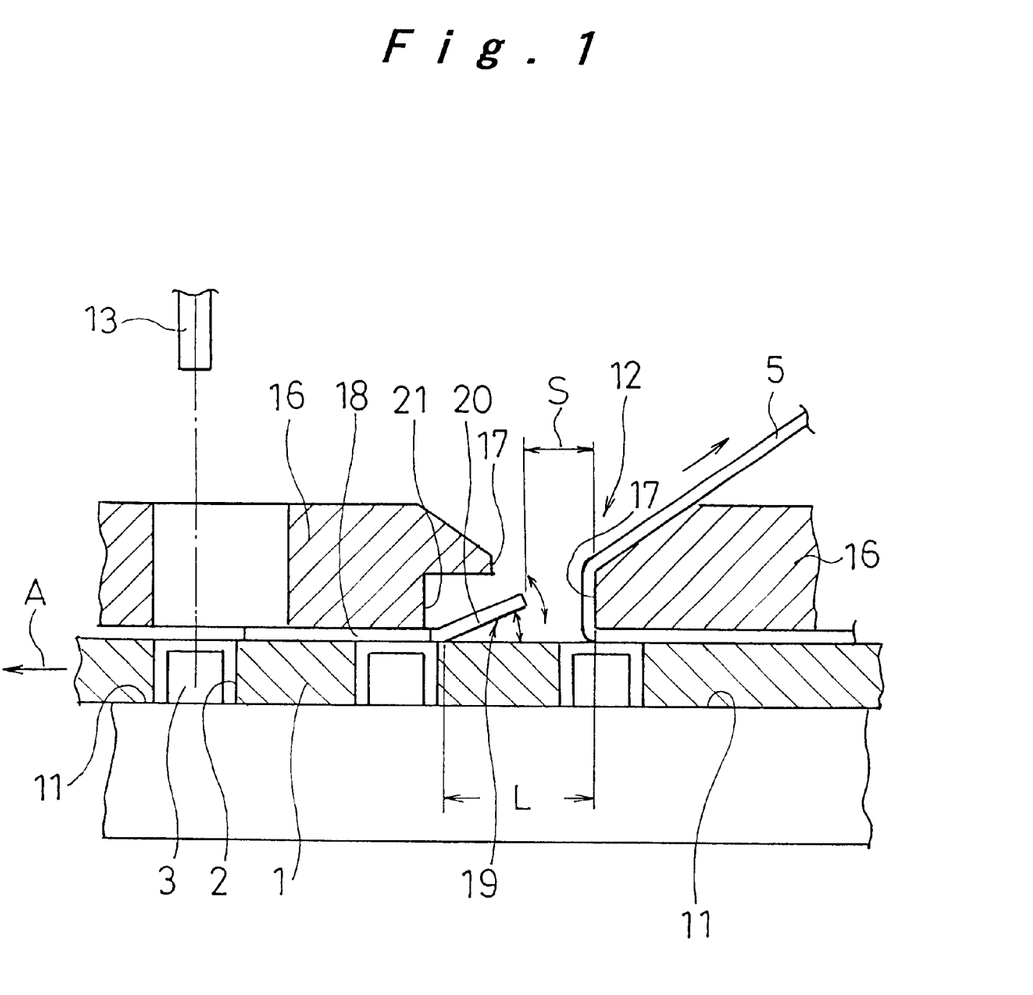
FIG. 1 is a cross sectional view showing major parts of one embodiment of the electronic component supply device according to the present invention.
Figure 2:
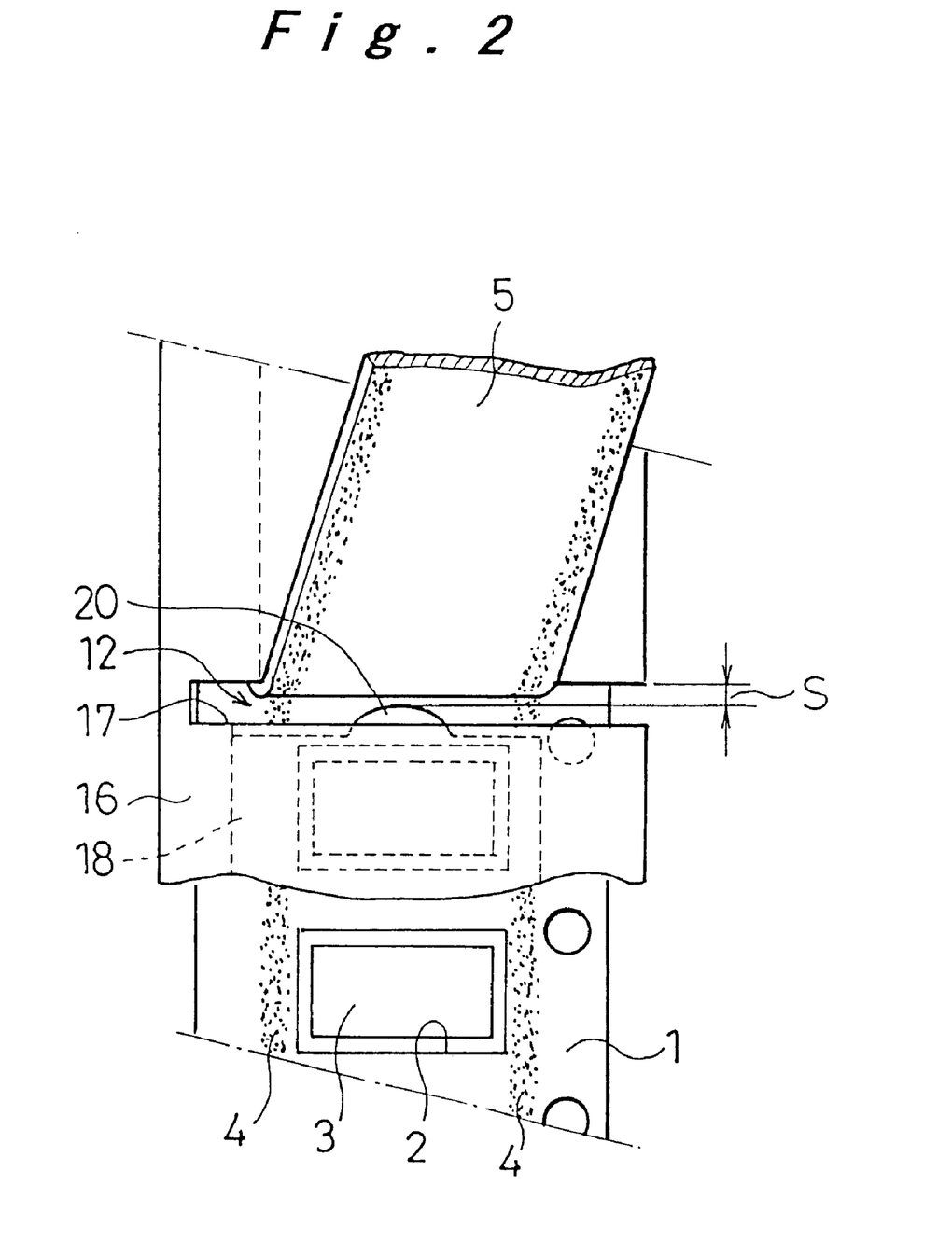
FIG. 2 is a plan view showing major parts of the same embodiment of the electronic component supply device.

As shown in FIGS. 1 and 2, electronic components 3 are accommodated within cavities 2 in a carrier tape 1; the surface of the carrier tape 1 is covered with a removable top tape 5 at adhering portions 4. This carrier tape 1 is in a state of being pressed against the tape transfer surface 11 by a tape pressing member 16 having a U-shaped cross section and is transferred in a tape transfer direction (arrow A) on the tape transfer surface 11.

In the tape pressing member 16, a peeling portion 12 is provided at a position to the front of where the electronic components 3 are removed with a suction nozzle 13. When the carrier tape 1 is transferred through this peeling portion 12, the top tape 5 is peeled away. As shown in FIGS. 1 and 2, the peeling portion 12 comprises a peel-away cutout portion 17 cut into the tape pressing member 16, and a thin plate 18 which can be elastically deformed and which is fixed to the lower surface of the tape pressing member 16 facing the upper surface of the carrier tape 1 at a location downstream of the peel-away cutout portion 17 in the tape transfer direction.

The base end portion of the thin plate 18 is fixed to the lower surface of the tape pressing member 16, while the free end thereof protrudes at an angle upwards into the peel-away cutout portion 17, thereby narrowing the opening width S of the peeling portion 12. The tip of the thin plate 18 that defines the opening width S of the peeling portion 12 is formed in a rounded shape, while the other portion of the thin plate 18 is formed to cover the entirety of the electronic components as shown in FIG. 2. By forming this rounded portion 20 at the tip of the thin plate 18, the strength thereof is ensured, and the opening width S of the peeling portion 12 is defined such as not to allow the electronic components to jump out therethrough.

Figure 4:
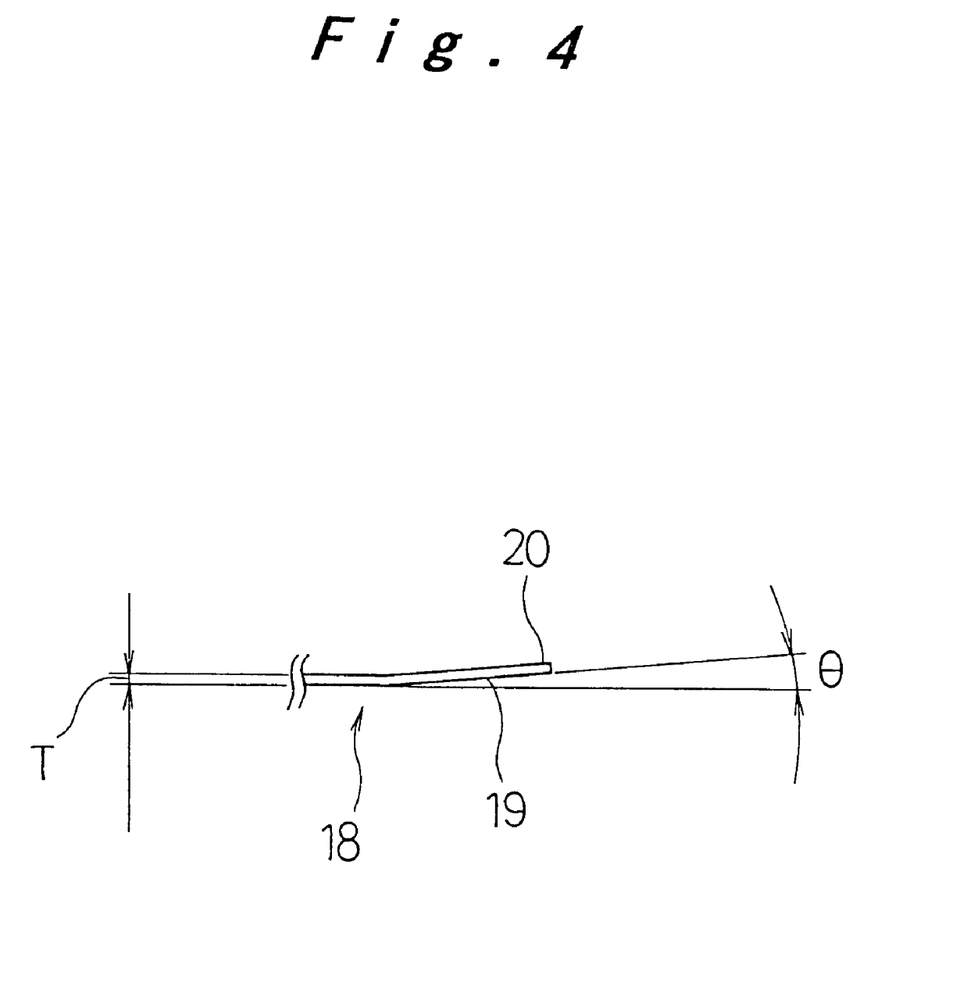
FIG. 4 is an enlarged view of the thin plate.

The free end portion of the thin plate 18 having a thickness T of about 0.08 mm consists of an angled portion 19 inclined at an angle θ of about 4–6° as shown in FIG. 4. This angled portion 19 reduces the resistance applied to the top tape 5 when it is taken up after being stopped by the thin plate 18, and thereby allows the top tape 5 to return to its normal state smoothly.

In the tape pressing member 16, a concavity 21 is formed so that the angled portion 19 of the thin plate 18 can be deformed elastically. This concavity 21 is formed to dimensions to allow the deformation, but not the plastic deformation, of the entire angled portion 19 of the thin plate 18. The opening width S of the peeling portion 12 is narrower than the width W of a conventional peel-away cutout portion 117 shown in FIG. 7. The greater the length L is of the angled portion 19 including the opening width S of the peeling portion 12, the more stably the thin plate 18 performs its function of preventing peeling failure. In this embodiment, the length L is set about 1.6 mm.

Figure 3:
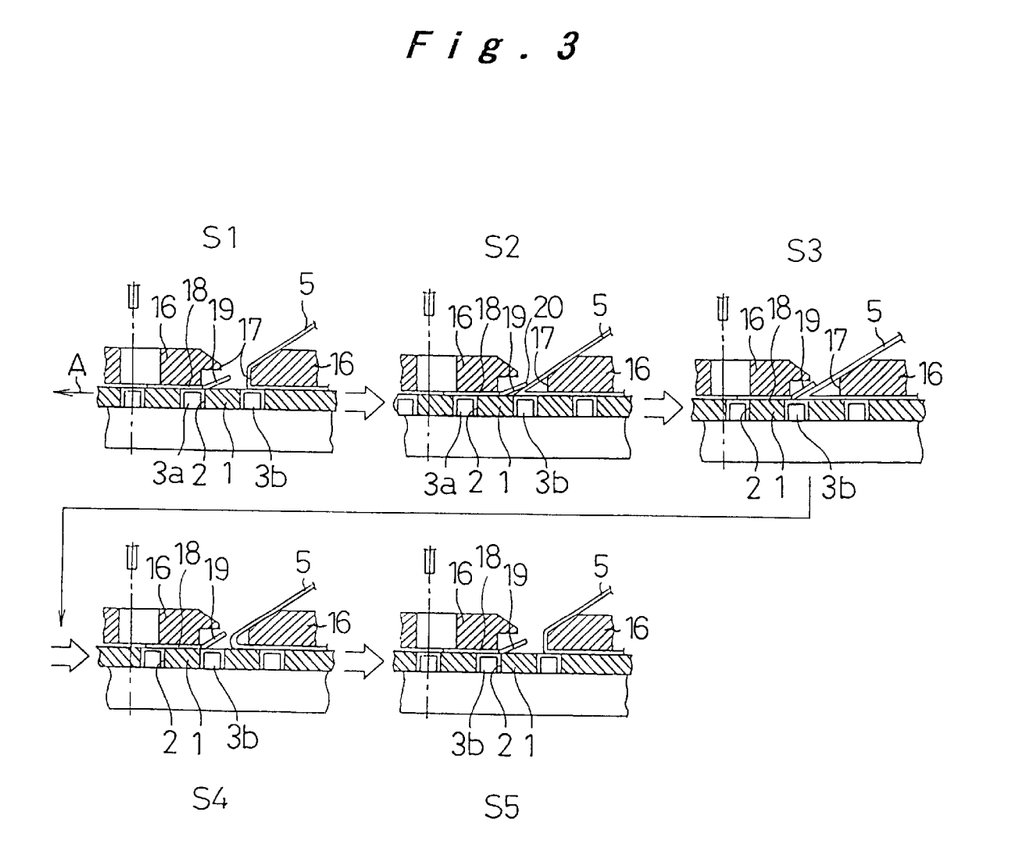
FIG. 3 is a cross sectional view showing how the thin plate prevents the top tape from entering between the tape pressing member and the carrier tape in the electronic component supply device of the present invention.

FIG. 3 shows how the thin plate 18 prevents the peeling failure of the top tape. At step 1 (S1), the top tape 5 above the component 3a has been separated, and the top tape 5 above the component 3b is about to be peeled off by the forward movement of the carrier tape 1 in the direction of arrow A. Normally, the top tape 5 that is drawn out through the peel-away cutout portion 17 is successively peeled off by the advancement of the carrier tape 1 in a state of S1 in FIG. 3. At times, however, depending on the correlation between the adhesive force of the top tape and the feeding speed of the carrier tape and/or the taking up force of the top tape, the top tape 5 remains adhered above the component 3b even until after the component 3b has arrived under the peeling portion 12 by the advancement of the carrier tape 1 as shown at S2.

The top tape 5 then attempts to advance together with the carrier tape 1 as adhered thereto, but contacts the tip of the angled portion 19 of the thin plate 18 disposed to the front of the peel-away cutout portion 17, whereby the advancement of the top tape 5 is obstructed. Here, since the tip of the angled portion 19 is formed in a rounded shape as mentioned above, the angled portion 19 contacts and stops the top tape 5 without exerting thereto an excessive load.

When the carrier tape 1 is further advanced under this state, the peeling force or the taking up force of the top tape 5 causes the thin plate 18 to elastically deform upwards as shown at S3. Thus the thin plate 18 first stops the advancement of the top tape 5 by contacting therewith at its tip, and thereafter reduces the load exerted to the top tape by elastic deformation. Even if the peeling of the top tape 5 is delayed, its advancement is obstructed, and after that, the top tape 5 can return to its normal state without being subject to load against the peeling force. Furthermore, the thin plate 18 is given the resiliency such that it deforms elastically with a load smaller than the peeling force of the top tape 5. Accordingly, the thin plate 18 releases the top tape 5 without failure at step 3 (S3) to assist the smooth return of the top tape 5. In this embodiment of the electronic component supply device, the peeling speed of the top tape 5 is set about 300 mm/min, in accordance of which the top tape 5 is peeled off with the force of about 3.0–4.0N.

After being stopped by the thin plate 18, the top tape 5 returns spontaneously by the taking up force. At this time the resistance against the taking up force of the top tape 5 is reduced by the elastic deformation of the thin plate 18 as described above. The top tape 5 is thus smoothly peeled off from the carrier tap 1 as shown at S4. Finally, the top tape returns to its normal state as shown at S5 by the advancement of the carrier tape 1 and by being taken up on the receiving cap.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An electronic component supply device, comprising:
   a carrier tape, in which electronic components are held within cavities;
   a removable top tape for covering the surface of the carrier tape;
   a tape pressing member for pressing the carrier tape from above against a transfer surface along which the carrier tape is transferred;

a peeling portion provided in the tape pressing member for separating the top tape from the carrier tape thereby removing the electronic components from the cavities in the carrier tape, having a peel away cut-out portion; and a thin plate having a base end portion and a free end portion; wherein the peel-away cutout portion is formed in the tape pressing member so that the top tape is peeled away from the carrier tape and is drawn out through the peel-away cutout portion; and said thin plate, is elastically deformable, and is fixed at the base end portion to a lower surface of the tape pressing member facing an upper surface of the carrier tape at a location downstream of the peel-away cutout portion of the tape pressing member in a tape transfer direction, and the free end portion of the thin plate protrudes obliquely upwards toward the peel-away cutout portion.

2. The electronic component supply device according to claim 1, further comprising a concavity formed in the peeling portion of the tape pressing member whereby the free end portion of the thin plate can deform within the concavity.

3. The electronic component supply device according to claim 1, wherein the thin plate deforms elastically with a load smaller than a force for peeling off the top tape from the carrier tape.

4. The electronic component supply device according to claim 1, wherein the thin plate has a distal end and is formed in a rounded shape at least at the distal end, facing the peel-away cutout portion, and other portions of the thin plate have a width sufficient to cover the entirety of the electronic components within the cavities in the carrier tape.

* * * * *